United States Patent
Zhou (10) Patent No.: US 9,198,285 B2
(45) Date of Patent: *Nov. 24, 2015

(54) TOUCH SCREEN AND CONDUCTIVE LAYER THEREOF (71) Applicant: NANCHANG O-FILM TECH. CO., LTD., Nanchang (CN)

(72) Inventor: Fei Zhou, Nanchang (CN)

(73) Assignee: Nanchang O-Film Tech. Co., Ltd., Nanchang, Jiangxi (CN)

( * ) Notice: Subject to any disclaimer, the term of this patent is extended or adjusted under 35 U.S.C. 154(b) by 51 days.

This patent is subject to a terminal disclaimer.

(21) Appl. No.: 14/000,024

(22) PCT Filed: Jul. 8, 2013

(86) PCT No.: PCT/CN2013/078975
§ 371 (c)(1),
(2) Date: Aug. 16, 2013

(87) PCT Pub. No.: WO2014/146384
PCT Pub. Date: Sep. 25, 2014

(65) Prior Publication Data
US 2014/0284082 A1  Sep. 25, 2014

(30) Foreign Application Priority Data

Mar. 20, 2013 (CN) .......................... 2013 1 0090535

(51) Int. Cl.
*H05K 1/02* (2006.01)
*H05K 3/12* (2006.01)
(Continued)

(52) U.S. Cl.
CPC .............. *H05K 1/0296* (2013.01); *G06F 3/044* (2013.01); *H05K 3/1258* (2013.01);
(Continued)

(58) Field of Classification Search
CPC ...................................................... H05K 1/0296
USPC .............................................. 174/251, 126.1
See application file for complete search history.

(56) References Cited

U.S. PATENT DOCUMENTS 8,179,381 B2    5/2012  Frey et al.
2007/0247443 A1  10/2007  Philipp
(Continued)

FOREIGN PATENT DOCUMENTS

CN    101819482 A    9/2010
CN    101887324 A    11/2010
(Continued)

OTHER PUBLICATIONS

International Search Report, International application No. PCT/CN2013/078975. Date of mailing: Jan. 9, 2014. SIPO, Beijing, China.

*Primary Examiner* — Timothy Thompson
*Assistant Examiner* — Charles Pizzuto
(74) *Attorney, Agent, or Firm* — Coats & Bennett, P.L.L.C.

(57) ABSTRACT

The present invention relates to a conductive layer of a touch screen. The conductive layer is a mesh composed of metal wires. The mesh comprises a plurality of mesh cells, and the mesh cell comprises a plurality of mesh edges and nodes formed by connecting two adjacent edges. The conductive layer comprises a sensing region and a wire region which is electrically connected to the sensing region. The sensing region comprises a plurality of first sensing patterns and a plurality of second sensing patterns; the first sensing pattern and the second sensing pattern is adjacent and electrically insulated from each other; the mesh cells in each first sensing pattern are electrically connected with each other; and the mesh cells in each second sensing pattern are electrically connected with each other.

13 Claims, 9 Drawing Sheets

(51) Int. Cl.
*G06F 3/044* (2006.01)
*H05K 1/03* (2006.01)
*H05K 1/09* (2006.01)

(52) U.S. Cl.
CPC .............. *G06F 2203/04103* (2013.01); *G06F 2203/04112* (2013.01); *H05K 1/0289* (2013.01); *H05K 1/0306* (2013.01); *H05K 1/097* (2013.01); *H05K 2201/09681* (2013.01); *H05K 2203/0108* (2013.01)

(56) References Cited

U.S. PATENT DOCUMENTS

| | | |
|---|---|---|
| 2010/0123670 A1 | 5/2010 | Philipp |
| 2010/0182272 A1 | 7/2010 | Kang et al. |
| 2011/0141051 A1 | 6/2011 | Ryu |
| 2012/0062250 A1 | 3/2012 | Kuo |
| 2014/0002369 A1* | 1/2014 | Guard .......................... 345/173 |
| 2014/0063375 A1 | 3/2014 | Kuriki |
| 2015/0009420 A1* | 1/2015 | Zhou ............................ 349/12 |

FOREIGN PATENT DOCUMENTS

| | | |
|---|---|---|
| CN | 102216891 A | 10/2011 |
| CN | 102722279 A | 10/2012 |
| CN | 103176657 A | 6/2013 |
| JP | 2007293865 A | 11/2007 |
| JP | 2010039537 A | 2/2010 |
| JP | 2012508937 A | 4/2012 |
| JP | 2012238275 A | 12/2012 |
| KR | 20100021112 A | 2/2010 |
| KR | 20100137483 A | 12/2010 |
| KR | 20110089423 A | 8/2011 |
| TW | 201023014 A | 6/2010 |
| TW | 201211867 A | 3/2012 |
| WO | 2010057059 A1 | 5/2010 |
| WO | 2013012260 A2 | 1/2013 |

* cited by examiner

TOUCH SCREEN AND CONDUCTIVE LAYER THEREOF

FIELD OF THE INVENTION

The present disclosure relates to a touch screen, and more particularly relates to a conductive layer of the touch screen.

BACKGROUND OF THE INVENTION

Touch screen is a touch sensor device which can receive input signal. Touch screen gives a new appearance to information interaction, it is a new attractive information interactive device. The development of the touch screen technology causes a widespread concern of the domestic and foreign information media, it becomes a new rising high-tech force in the photoelectric industry.

Conductive layer is a crucially important part of a touch screen. Currently, the conductive layer of the touch screen is mostly made of ITO (indium-tin oxide) formed on the insulating substrate through vacuum coating, graphical etching, it is costly on process and equipment, a large number of ITO material will be wasted in etching, and it will produce a large number of industrial wastewater containing heavy metals.

SUMMARY OF THE INVENTION

Based on this, it is necessary to provide a new kind of conductive layer of touch screen for the problems of the material waste in the manufacturing process of using ITO as a conductive layer.

A conductive layer of a touch screen, wherein the conductive layer is a mesh composed of metal wires, the mesh comprises a plurality of mesh cells, the mesh cell comprises a plurality of mesh edges and nodes formed by connecting two adjacent edges, the conductive layer comprises a sensing region and a wire region electrically connected to the sensing region, the sensing region comprises a plurality of first sensing patterns and a plurality of second sensing patterns, the first sensing pattern and the second sensing pattern is adjacent and electrically insulated from each other, the mesh cells in each first sensing pattern are electrically connected with each other, the mesh cells in each second sensing pattern are electrically connected with each other.

In one embodiment, the first sensing pattern comprises a first main line extending along a second axis of a two-dimensional coordinate and a plurality of first side shoots extending laterally along the first main line, the second sensing pattern comprises a second main line extending along the second axis of the two-dimensional coordinate and a plurality of second side shoots extending laterally along the second main line, those second main line has a mutual interval between head and end, the first side shoot and the second side shoot are arranged alternately with intervals.

In one embodiment, the first side shoot and the second side shoot extend along a first axis of the two-dimensional coordinate, the first main line and the second main line are parallel.

In one embodiment, the conductive layer further comprises a color matching line which forms complementary pattern with the sensing area and the wire area, the sensing area and the wire area are electrically insulated.

In one embodiment, the color matching line forms a mesh, the mesh cell of the mesh formed by the color matching line has the same shape and size as the mesh cell of the mesh of the first sensing pattern and the second sensing pattern.

In one embodiment, the color matching line between the adjacent first sensing pattern and second sensing pattern loses a mesh edge meeting the insulated track.

In one embodiment, the color matching line between the adjacent first sensing pattern and second sensing pattern is disconnected from the middle of the mesh edge.

In one embodiment, the disconnection has a length of 2-20 µm.

In one embodiment, the disconnection has a length of 3-9 µm.

In one embodiment, the disconnection has a length of 6 µm.

In one embodiment, the color matching line between the adjacent first sensing pattern and second sensing pattern is disconnected from the node of the mesh where the first sensing pattern and the second sensing pattern are adjacent.

In one embodiment, the mesh cell of the mesh is a diamond.

In one embodiment, the sensing area comprises a left sensing area and a right sensing area, which are mutually separated, each left sensing area and right sensing area comprises a plurality of first sensing patterns and a plurality of second sensing patterns, the wire area is disposed between the left sensing area and the right sensing area.

In one embodiment, the conductive layer is axial symmetry.

It is necessary to provide a touch screen including a glass substrate, a conductive layer and a base material layer disposed on a surface of the glass substrate, the conductive layer is embedded in the base material layer, the conductive layer is a mesh composed of metal wires, the mesh comprises a plurality of mesh cells, the mesh cell comprises a plurality of mesh edges and nodes formed by connecting two adjacent edges, the conductive layer comprises a sensing region and a wire region electrically connected to the sensing region, the sensing region comprises a plurality of first sensing patterns and a plurality of second sensing patterns, the first sensing pattern and the second sensing pattern is adjacent and electrically insulated from each other, the mesh cells in each first sensing pattern are electrically connected with each other, the mesh cells in each second sensing pattern are electrically connected with each other.

In one embodiment, the base material layer defines a trench on a side thereof away from the glass substrate, the conductive layer is received in the trench, the trench is formed by embossing using an embossing mold with a preset protrusion.

In one embodiment, the depth-to-width ratio of the trench is more than 1.

In one embodiment, a depth of the trench is no less than the thickness of the conductive layer.

In one embodiment, it further comprises a protective layer, the protective layer covers the base material layer and the conductive layer.

In one embodiment, it further comprises a wire region, the wire region is disposed beside the second sensing pattern, the wire region comprises a plurality of wire clusters composed of metal wires, one end of each wire cluster is electrically connected to one of the second sensing pattern, the other end extends into one edge of the base material layer.

The conductive layer of the touch screen has a structure of metal mesh, which can be manufactured by embossing process, compared with the conventional process which uses ITO as a conductive layer, mesh shape can be one-step formed, the process is simple, the yield is high. And the material cost is greatly reduced by using metal instead of ITO, since no etching process is used, the conductive material will not be wasted, and it reduces heavy metal emission in the waste liquid.

DETAILED DESCRIPTION OF THE EMBODIMENTS

The invention will be described in detail with the drawings, for easy understanding. The preferred embodiment of the present invention is given in the drawings. However, the present invention can be implemented in different ways, not limited to the embodiments described here. On the contrary, the object of providing these embodiments is to make the content of the invention disclosed more thoroughly and comprehensively.

It need to be clear, when a component is called "fixed" on another component, it can directly on another component or there can exist component between them. When a component is considered to be "connected" to another component, it can be directly connected to another component or there may exist component between them at the same time. In this paper, the use of the term "vertical", "horizontal", "up", "down", "left", "right", "horizontal", "vertical" and similar expressions are for illustration purposes only.

Unless otherwise defined, the technical and scientific terms used in this paper has the same meaning as the commonly understood of those skilled in the art. The object of the terms used in the specification of the present invention in this paper is for describing the specific embodiments, instead of limiting the present invention. The term "and/or" used in this paper includes the one or more related items' combinations.

Figure 1:
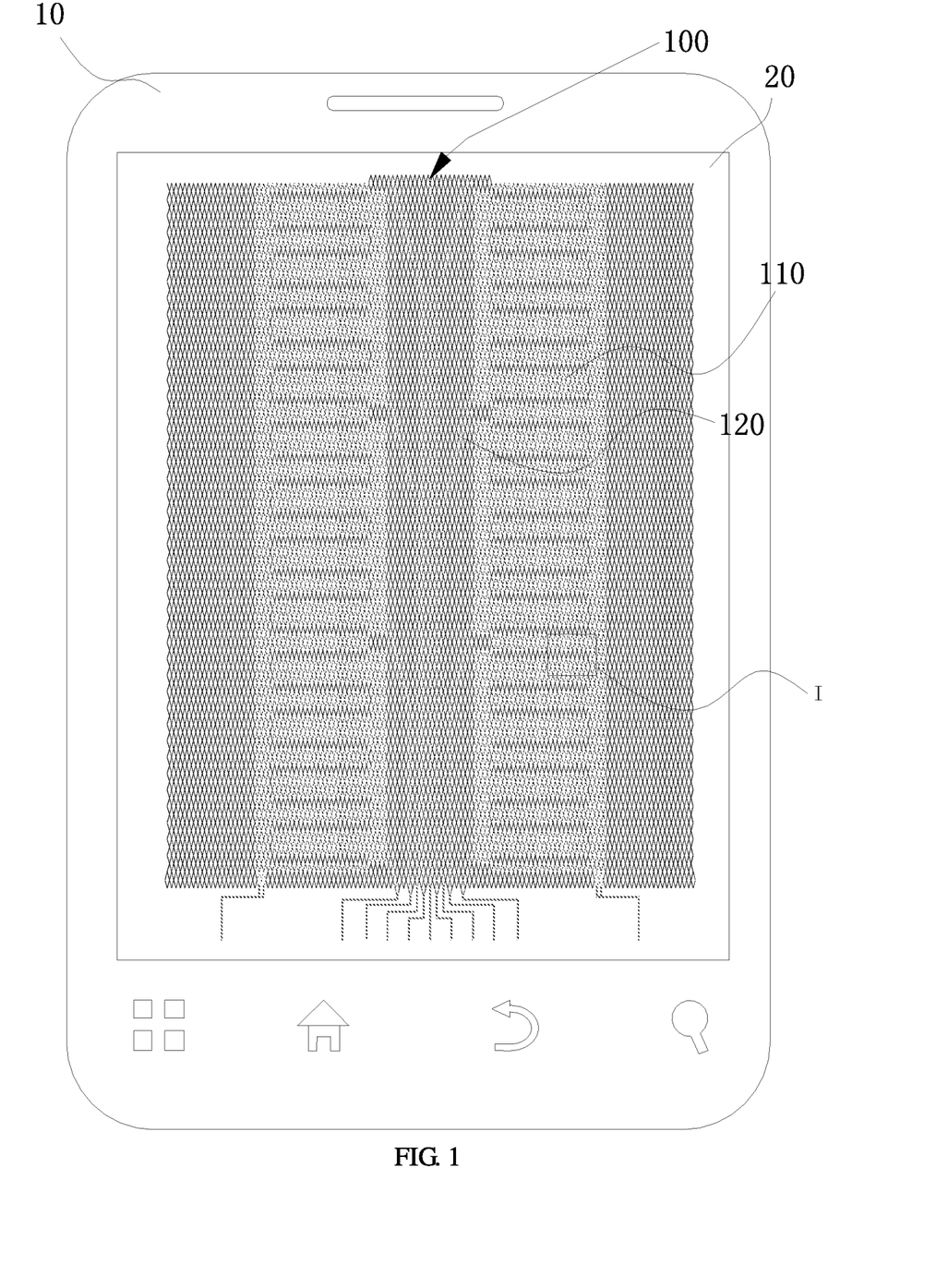
FIG. 1 is a schematic view of a touch screen in one embodiment.

FIG. 1 is a schematic view of a touch screen in one embodiment, the touch screen includes a glass substrate 10, a base material layer 20 disposed on a surface of the glass substrate 10 and a conductive layer 100 embedded in the base material layer 20. The conductive layer 100 is a mesh composed of metal wires, the mesh includes a plurality of mesh cells, the mesh cell includes a plurality of mesh edges and nodes formed by connecting two adjacent edges. In this embodiment, each mesh cell of the metal mesh is a diamond, in other embodiment, the mesh cell can be other shapes, for example, rectangle, triangle and etc.

Figure 5:
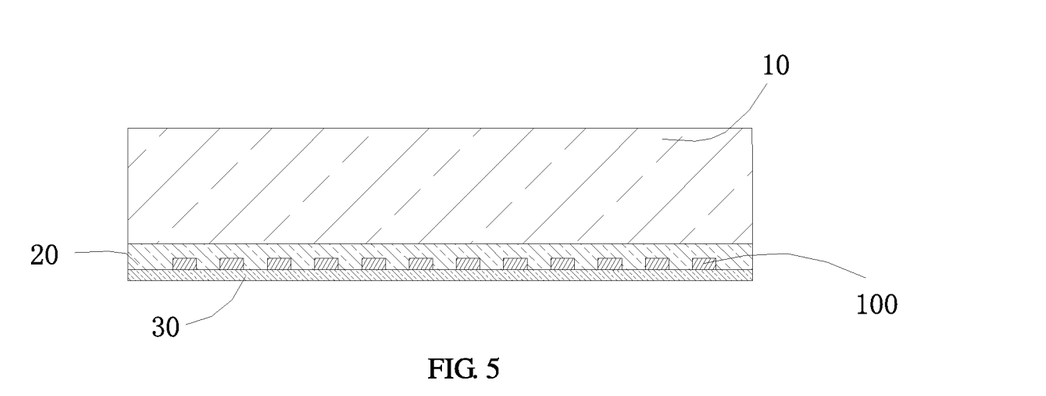
FIG. 5 is a cross-sectional view of a touch screen in one embodiment.
Figure 6A:
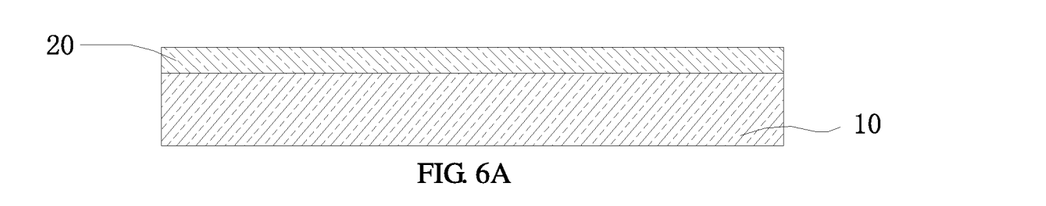
FIG. 6A-6C are cross-sectional views of touch screen in manufacturing steps.
Figure 6B:
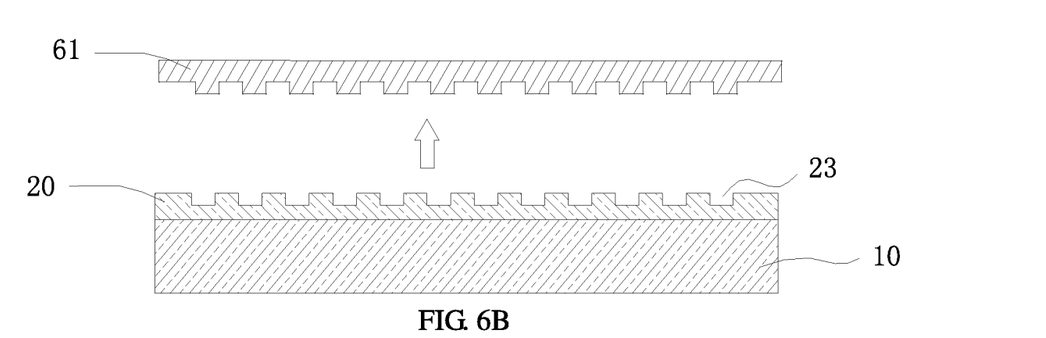
Figure 6C:
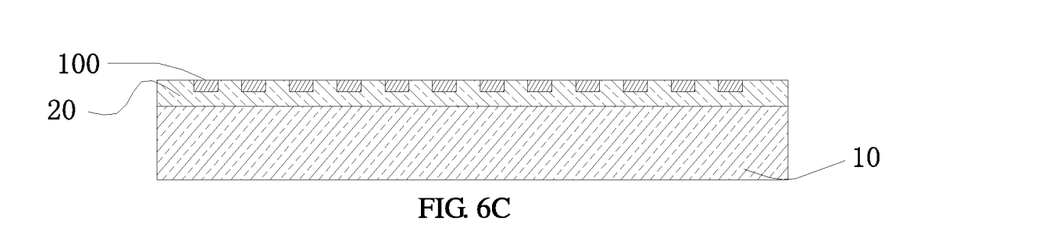

FIG. 5 is a sectional view of a touch screen in one embodiment, FIG. 6A-6C are sectional views of touch screen in manufacturing. The base material layer 20 is formed by jell curing, therefore its thickness is less than that of the glass substrate 10. In this embodiment, the jell which forms the base material layer 20 is solvent-free UV curing acrylic resin. In other embodiments, the jell which forms the base material layer 20 can be other photo curable, thermosetting adhesive and self adhesive. Wherein the photo curable is a combination of prepolymer, monomer, photo initiator and additives in accordance with the molar ratio: 30~50%, 40~60%, 1~6% and 0.2~1%.wherein the prepolymer is at least one of epoxy acrylate, polyurethane, polyether acrylates, polyester acrylate and acrylic resin; the monomer is at least one of monofunctional (e.g. IBOA, IBOMA, HEMA and etc), double-functional (e.g. TPGDA, HDDA, DEGDA, NPGDA and etc), triple-functional (e.g. TMPTA, PETA and etc); the photo initiator is benzophenone, desoxybenzoin and etc. More specially, auxiliaries with a molar ratio of 0.2~1% can be added into the combination above. The auxiliaries can be hydroquinone, methoxy phenol, benzoquinone,2,6-di-tert-butyl-p-cresol and the like.

Referring to FIG. 6B, the base material layer 20 defines a trench 23 on a side thereof, the conductive layer 100 made of metal wires which is received in the trench 23. The trench 23 has a depth-to-width ratio of more than 1, and a depth of the trench is no less than the thickness of the conductive layer 100, to make the base material layer 20 can protect the metal wires.

Referring to FIG. 5, in this embodiment, the touch screen further includes a protective layer 30, the protective layer 30 covers the base material layer 20 and the conductive layer 100, to protect the base material layer 20 and the conductive layer 100.

Figure 7:
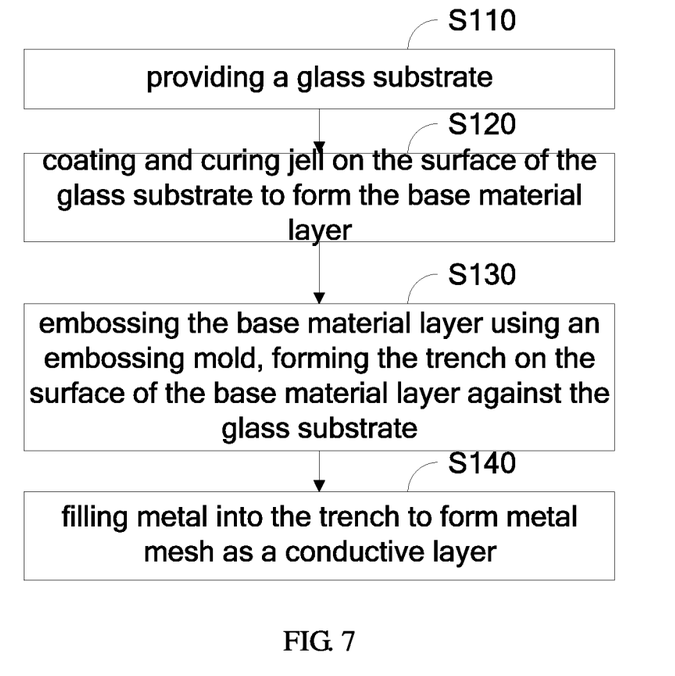
FIG. 7 is a flow chart of touch screen manufacturing method in one embodiment.

Also referring to FIG. 7, a method of manufacturing the touch screen (comprising the trench 23 and the conductive layer 100) includes:

S110, providing a glass substrate.

In this embodiment, the glass substrate 10 has a thickness of 125 μm. In other embodiments, the thickness of the glass substrate can be changed according to the actual need.

S120, coating and curing jell on the surface of the glass substrate 10 to form the base material layer 20.

Referring to FIG. 6, the base material layer 20 is formed by curing the jell which is coated on the glass substrate 10, the thickness of it is less than that of the glass substrate 10. In this embodiment, the jell which forms the base material layer 20 is solvent-free UV curing acrylic resin. In other embodiments, the jell which forms the base material layer 20 can be other photo curable, thermosetting adhesive and self adhesive. Wherein the photo curable is a combination of prepolymer, monomer, photo initiator and additives in accordance with the molar ratio: 30~50%, 40~60%, 1~6% and 0.2~1%.wherein the prepolymer is at least one of epoxy acrylate, polyurethane, polyether acrylates, polyester acrylate and acrylic resin; the monomer is at least one of monofunctional (e.g. IBOA, IBOMA, HEMA and etc), double-functional (e.g. TPGDA, HDDA, DEGDA, NPGDA and etc), triple-functional (e.g. TMPTA, PETA, etc.); the photo initiator is benzophenone, desoxybenzoin and etc. More specially, auxiliaries with a molar ratio of 0.2~1% can be added into the combination above. The auxiliaries can be hydroquinone, methoxy phenol, benzoquinone, 2,6-di-tert-butyl-p-cresol and the like.

S130, embossing the base material layer 20 using an embossing mold 61, forming the trench 23 on the surface of the base material layer 20 against the glass substrate 10.

Referring to FIG. 6, the trench 23 has a depth-to-width ratio of more than 1, and a depth no less than the thickness of the conductive layer 100, to make the base material layer 20 can protect the metal wires. In this embodiment, the trench has a depth of 3 μm, a width of 2.2 μm. In other embodiments, the size of the trench can be changed according to the actual need.

S140, filling metal into the trench 23, to form metal mesh as a conductive layer 100.

In this embodiment, a shape of the trench is a mesh, it can form interlacing metal wires and further form regular conductive mesh, through filling metal into the trench 23 which is formed by embossing. Specially, scraping technique is used to fill the trench 23 with nano silver ink, and then sintering at 150° C., the Ag in nano silver ink will be sintered into conductive wires. The silver ink solid has a content of 35%, solvent volatilizes in sintering process.

The conductive layer 100 includes a sensing region 110 and a wire region 120, the wire region 120 is used to connected with the PCB circuit.

In this embodiment, in order to reduce the color difference and get better display effect, the conductive layer 100 further includes a color matching line which forms complementary pattern with the sensing region 110 and the wire region 120, the color matching line is electrically insulated with the sensing region 110 and the wire region 120. In this embodiment, the mesh cell of the sensing region 110, the wire region 120 and the color matching line has the same shape and size, in other embodiment, it can be different, for example, the color matching line can be a zigzag or a broken line.

The conductive layer 100 in FIG. 1 is axisymmetric, the conductive layer 100 is axisymmetric with one of the perpendicular bisector, in other embodiment, the conductive layer 100 can be any other structure instead of axisymmetric. Also referring to FIG. 2B, the sensing region 110 includes at least one of first sensing patterns 111 and at least one of second sensing patterns 113, the first sensing pattern 111 and the second sensing pattern 113 is adjacent and electrically insulated from each other, the mesh cells in each first sensing pattern 111 are electrically connected with each other, the mesh cells in each second sensing pattern 113 are electrically connected with each other. Each second sensing pattern 113 is disposed beside the corresponding first sensing pattern 111. The wire region 120 is disposed beside the second sensing pattern 113, comprising a plurality of wire clusters composed of metal wires. One end of each wire cluster is electrically connected to one of the second sensing pattern 113, the other end extends into one edge of the base material layer 20.

Figure 2A:
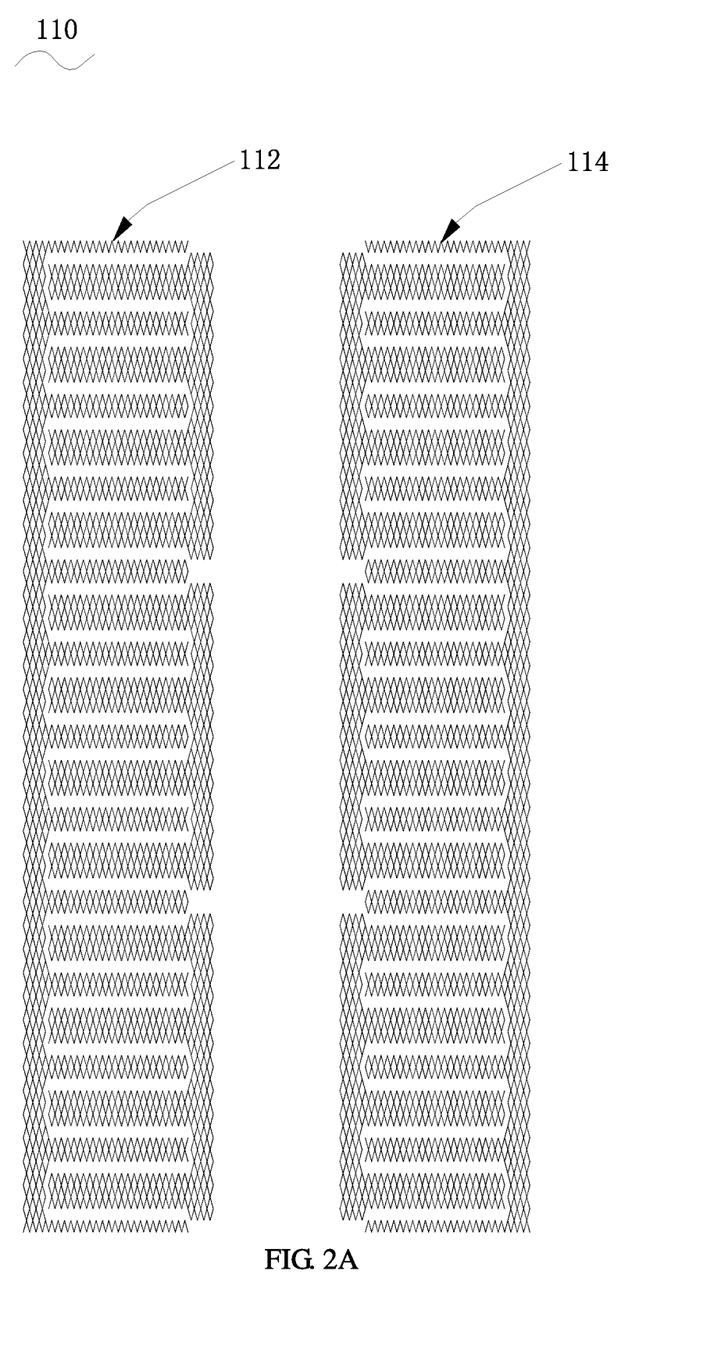
FIG. 2A is a structure schematic view of a sensing region.

Also referring to FIG. 2A, in this embodiment, the sensing region 110 includes a left sensing region 112 and a right sensing region 114, which are mutually separated, because of the axisymmetric conductive layer 100, the left sensing region 112 and the right sensing region 114 are axisymmetric, each left sensing region 112 and each right sensing region 114 includes at least one of first sensing pattern 111 and at least one of second sensing patter 113.

Figure 2B:
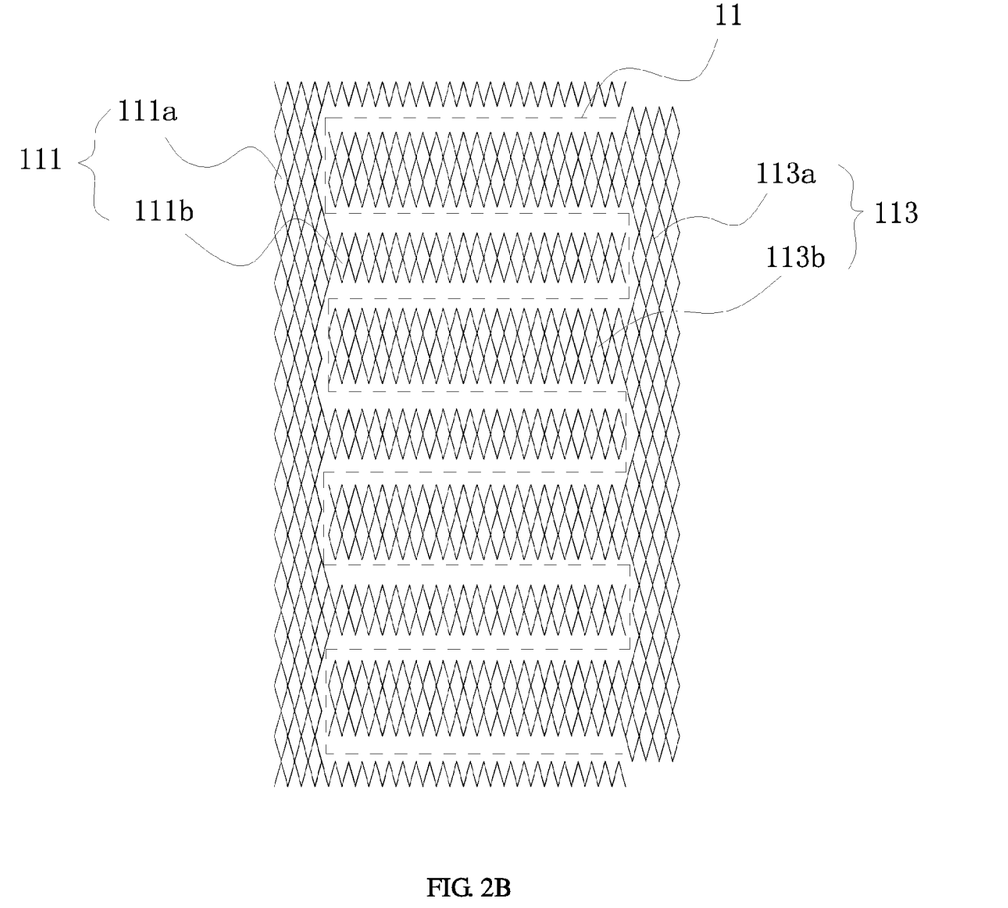
FIG. 2B is a partial view of FIG. 2A.

Referring to FIG. 2B, the first sensing pattern 111 includes a first main line 111a extending along a second axis of a two-dimensional coordinate and a plurality of first side shoots 111b extending laterally along the first main line 111a, the second sensing pattern 113 includes a second main line 113a extending along the second axis of the two-dimensional coordinate and a plurality of second side shoots 113b extending laterally along the second main line 113a, the second main line 113a has a mutual interval between head and end, the first side shoot 111b and the second side shoot 113b are arranged alternately with intervals, which forms mutual inductance between the second sensing pattern 113 and the first sensing pattern 111. The first side shoot 111b and the second side shoot 113b extend along a first axis of the two-dimensional coordinate department, the first side main line 111a and the second main line 113a are parallel.

In the detail embodiment in the drawings, the two-dimensional coordinate department is XOY rectangular coordinate system, the first axis is X axis, the second axis is Y axis. In other embodiment, the two-dimensional coordinate department can be any other coordinate system, e.g. a two-dimensional oblique coordinate system.

Figure 3A:
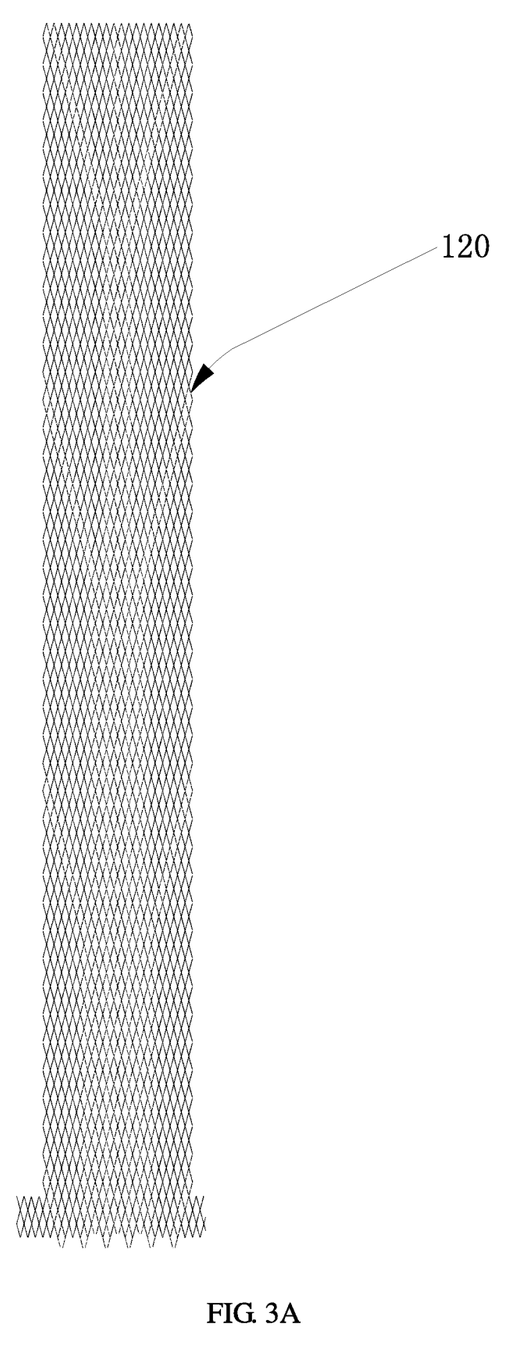
FIG. 3A is a structure schematic view of a wire region and a color matching line in the wire region and the sensing region.
Figure 3B:
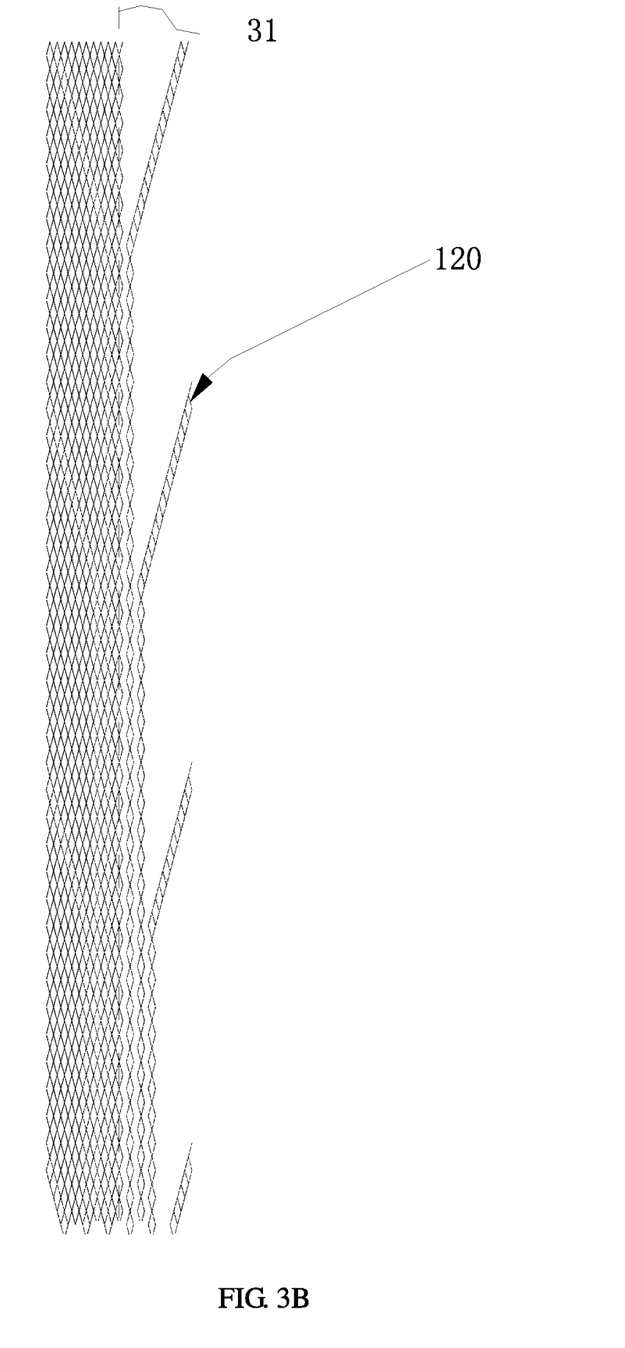
FIG. 3B is a schematic view of FIG. 3A without the color matching line right to the symmetry axis.

The wire region 120 is disposed between the left sensing region 112 and the right sensing region 114. FIG. 3A illustrates the wire region 120 and the color matching line structure between the wire region 120 and the sensing region 110. For easy distinguishing of the wire region 120 and the color matching line beside, FIG. 3B omits the color matching line right to the symmetry axis 31, and remains the color matching line left to the symmetry axis.

As mentioned above, the conductive layer 100 further includes the color matching line. According to the working principle of the touch screen, each first sensing pattern 111 and second sensing patter 113 are insulation with each other, therefore the present invention implements the insulation by filling the space between the first sensing pattern 111 and the second sensing pattern 113 with the color matching line, and disconnecting the color matching line.

Figure 4A:
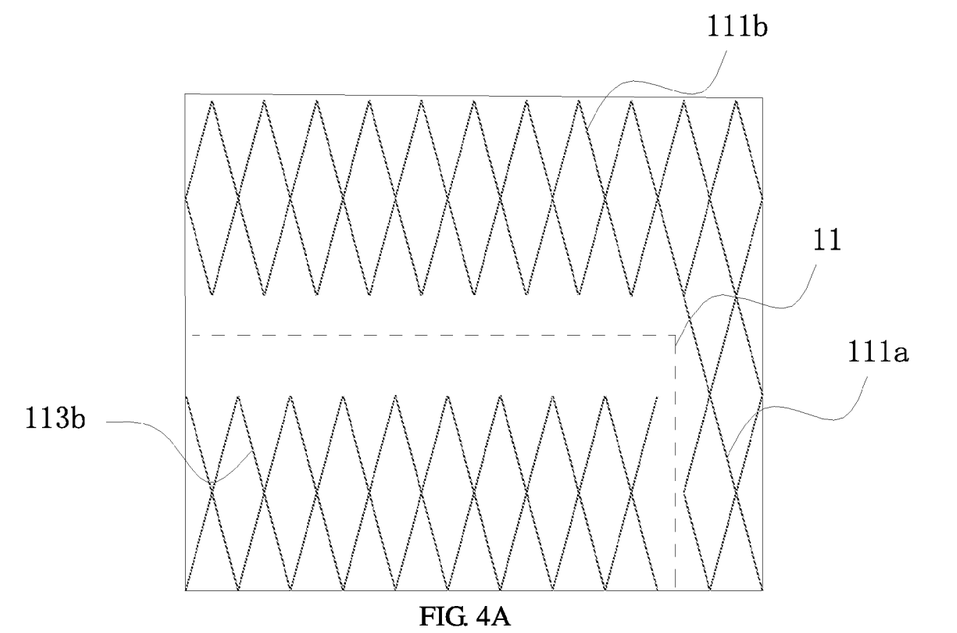
FIG. 4A-4D are schematic views of the color matching line which is disconnected to implement insulation in four different embodiments.

More specially, the present invention provides a plurality of disconnecting means, the following drawings illustrate the insulation structure in detail:

(1) The color matching line between the adjacent first sensing pattern and second sensing pattern loses a mesh edge meeting the insulated track. Referring to FIG. 4A, FIG. 4A is a insulation structure schematic of the color matching line which is disconnected to implement insulation in one embodiment, the position above the conductive layer 100 corresponds to the zone I in FIG. 1. The insulation track 11 is a line (it also may be a broken line or a curve) in the gap between the adjacent first sensing pattern 111 and the second sensing patter 113, for easy understanding, FIG. 2B also illustrates the insulation track 11. The insulation track is a broken line of this embodiment, comprising the part extending along the X axis and another part extending along the Y axis. In the embodiment of FIG. 4A, the color matching line between the first sensing pattern 111 and the second sensing pattern 113 is single-row/column structure, therefore all of the color matching lines between the first sensing pattern 111 and the second sensing pattern 113 are lost. The insulation structure (1) is equivalent to losing a plurality of mesh edges on the basis of the original mesh, without changing the mesh period, and therefore it will not lead to large color difference during the touch screen displaying.

Figure 4B:
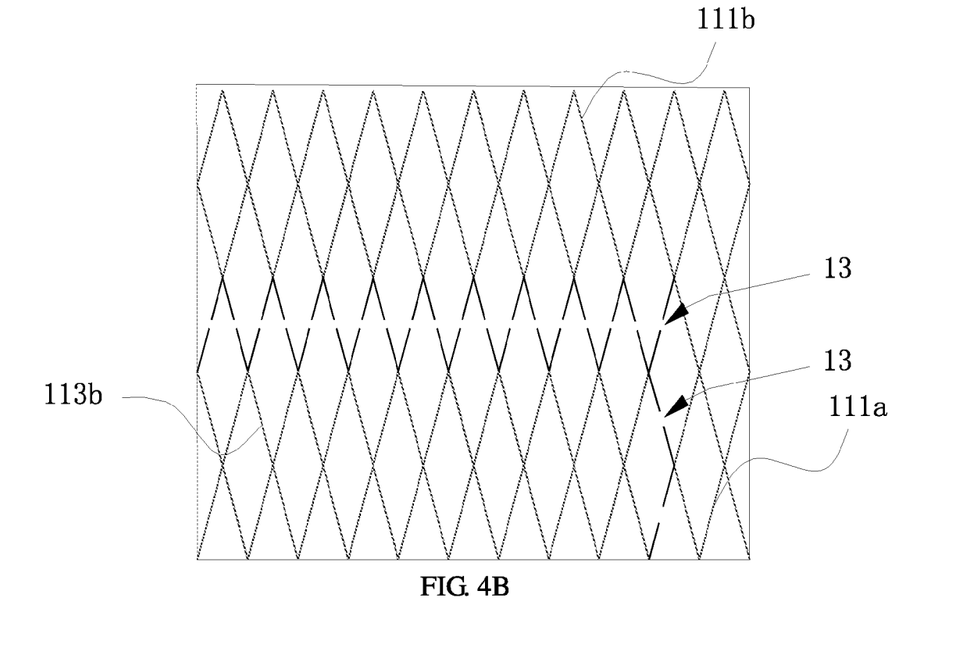

(2) The color matching line between the adjacent first sensing pattern and second sensing pattern is disconnected from the middle of the mesh edge. Referring to FIG. 4B, the disconnection part forms port 13, the disconnection has a length of 2-20 μm, a better disconnection has a length of 3-9 μm, in one preferred embodiment, the disconnection has a length of 6 μm. If the interval between the adjacent first sensing pattern 111 and the second sensing pattern 113 is wide, and there includes a plurality rows/columns of the color matching line, it is unnecessary to disconnect each mesh edge of the color matching line in theory, for example only one row/column of the color matching line (e.g. the color matching line meeting the insulation track) is disconnected. Considering the situation of the designed disconnection part is adhesion because of a bad job during the manufacturing process, more color matching lines can be designed to be disconnected, for example, each mesh edge of the color matching line of the adjacent first sensing pattern 111 and the second sensing pattern 113 is disconnected in the middle, to ensure insulation.

Figure 4C:
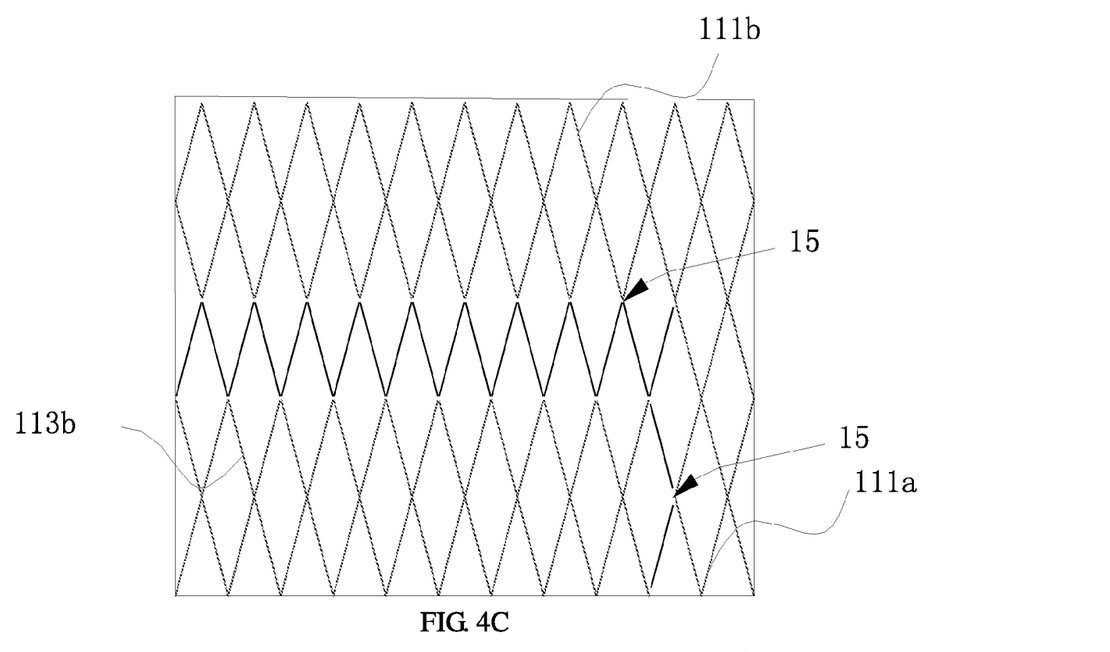

(3) The color matching line between the adjacent first sensing pattern 111 and second sensing pattern 113 is disconnected from the middle of the mesh node where the first sensing pattern 111 and the second sensing pattern is adjacent. Referring to FIG. 4C, it is disconnected from the mesh node 15. It is to be understood that the color matching line between the adjacent first sensing pattern 111 and the second sensing pattern 113 only need to be disconnected from the mesh node where it is adjacent to the first sensing pattern 111, or where it is adjacent to the second sensing pattern 113, and it implements insulation, considering the situation of the designed disconnection part is adhesion due to the operation errors during the manufacturing process, the color matching line can be disconnected from both the nodes where it is adjacent to the first sensing pattern 111 and the second sensing pattern 113.

Figure 4D:
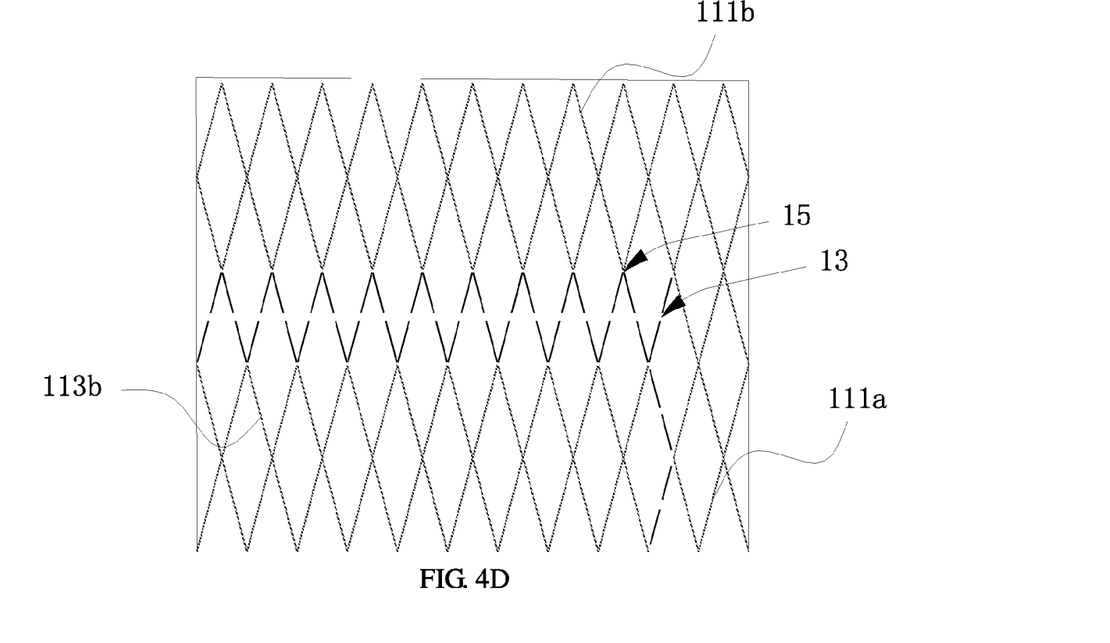

In the embodiment of FIG. 1, the means (2) and (3) are combined, referring to FIG. 4D, the color matching line between the adjacent first sensing pattern 111 and second sensing pattern 113 is disconnected from the mesh node 15 where it is adjacent to the first sensing pattern 111 and the second sensing pattern 113, the mesh edge between the disconnected mesh node 15 is disconnected from the middle and forms port 13.

The insulation structure (2), (3) above and the insulation structure of the embodiment in FIG. 4D, due to the disconnection part size can be ignored if compared to the mesh edges, it can further reduce color difference.

The conductive layer above has a structure of metal mesh, which can be manufactured by embossing process, compared with the conventional process which uses ITO as a conductive layer, mesh shape can be one-step formed, the process is simple, the yield is high. And the material cost is greatly reduced by using ITO instead of metal, because of not using etching process, conductive material will not be wasted, and it reduces heavy metal emission in the waste liquid.

Although the invention has been described in language specific to structural features and/or methodological acts, it is to be understood that the invention defined in the appended claims is not necessarily limited to the specific features or acts described. Rather, the specific features and acts are disclosed as sample forms of implementing the claimed invention.

What is claimed is:

1. A conductive layer of a touch screen, wherein the conductive layer is a mesh composed of metal wires, the mesh comprises a plurality of mesh cells, and the mesh cell comprises a plurality of mesh edges and nodes formed by connecting two adjacent edges, the conductive layer comprising:
   a sensing region;
   a wire region which is electrically connected to the sensing region; and
   a color matching line which forms complementary pattern with the sensing region and the wire region, the sensing region and the wire region are electrically insulated;
   wherein the sensing region comprises a plurality of first sensing patterns and a plurality of second sensing patterns, wherein the first sensing pattern and the second sensing pattern are adjacent and electrically insulated from each other, wherein the mesh cells in each first sensing pattern are electrically connected with each other, and wherein the mesh cells in each second sensing pattern are electrically connected with each other.

2. The conductive layer of the touch screen of claim 1, wherein the first sensing pattern comprises a first main line extending along a second axis of a two-dimensional coordinate and a plurality of first side shoots extending laterally along the first main line, the second sensing pattern comprises a second main line extending along the second axis of the two-dimensional coordinate and a plurality of second side shoots extending laterally along the second main line, each second main line has a mutual interval between head and end, the first side shoot and the second side shoot are arranged alternately with intervals.

3. The conductive layer of the touch screen of claim 1, wherein the first side shoot and the second side shoot extend along a first axis of the two-dimensional coordinate, the first side main line and the second main line are parallel.

4. The conductive layer of the touch screen of claim 1, wherein the color matching line forms a mesh, the mesh cell of the mesh formed by the color matching line has the same shape and size as the mesh cell of the mesh of the first sensing pattern and the second sensing pattern.

5. The conductive layer of the touch screen of claim 1, wherein the color matching line between the adjacent first sensing pattern and second sensing pattern loses a mesh edge meeting the insulated track.

6. The conductive layer of the touch screen of claim 1, wherein the color matching line between the adjacent first sensing pattern and second sensing pattern is disconnected from the middle of the mesh edge.

7. The conductive layer of the touch screen of claim 6, wherein the disconnection has a length of 2-20 μm.

8. The conductive layer of the touch screen of claim 7, wherein the disconnection has a length of 3-9 μm.

9. The conductive layer of the touch screen of claim 8, wherein the disconnection has a length of 6 μm.

10. The conductive layer of the touch screen of claim 1, wherein the color matching line between the adjacent first sensing pattern and second sensing pattern is disconnected from the node of the mesh where the first sensing pattern and the second sensing pattern are adjacent.

11. The conductive layer of the touch screen of claim 1, wherein the mesh cell of the mesh is a diamond.

12. The conductive layer of the touch screen of claim 1, wherein the sensing region comprises a left sensing area and a right sensing area, which are mutually separated, each left sensing area and right sensing area comprises a plurality of first sensing patterns and a plurality of second sensing patterns, the wire region is disposed between the left sensing area and the right sensing area.

13. The conductive layer of the touch screen of claim 1, wherein the conductive layer is axial symmetry.

* * * * *